United States Patent
Namkoong et al.

(10) Patent No.: US 9,448,270 B2
(45) Date of Patent: Sep. 20, 2016

(54) PULSE INJECTION APPARATUS

(71) Applicant: ELECTRONICS AND TELECOMMUNICATIONS RESEARCH INSTITUTE, Daejeon (KR)

(72) Inventors: Up Namkoong, Daejeon (KR); Seung-Kab Ryu, Daejeon (KR); Uijung Kim, Daejeon (KR); Kwang-Uk Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 212 days.

(21) Appl. No.: 14/161,416

(22) Filed: Jan. 22, 2014

(65) Prior Publication Data

US 2015/0004847 A1 Jan. 1, 2015

(30) Foreign Application Priority Data

Jun. 27, 2013 (KR) .................. 10-2013-0074673

(51) Int. Cl.
*H01R 24/42* (2011.01)
*G01R 31/02* (2006.01)
*H01R 24/54* (2011.01)
*G01R 31/00* (2006.01)

(52) U.S. Cl.
CPC ........... *G01R 31/021* (2013.01); *G01R 31/001* (2013.01); *H01R 24/42* (2013.01); *H01R 24/542* (2013.01)

(58) Field of Classification Search
CPC .... H01R 24/542; H01R 24/54; H01R 24/38; H01R 24/40; H01R 24/42; H01R 25/003; G01R 31/001; G01R 31/021
USPC ...... 361/117–119; 333/81 R–81 B, 136–137; 439/581–582, 638, 76.1
See application file for complete search history.

(56) References Cited

U.S. PATENT DOCUMENTS 5,477,153 A 12/1995 Murray
6,888,421 B2 * 5/2005 Jocher ...................... H01P 1/22
333/137

(Continued)

FOREIGN PATENT DOCUMENTS

KR 10-2012-0037156 A 4/2012
KR 10-1205958 B1 11/2012

OTHER PUBLICATIONS

Slavko Radman et al., "Capacitive coupling clamp," IEEE Softcom conference, 2008.

*Primary Examiner* — Felix O Figueroa
(74) *Attorney, Agent, or Firm* — LRK Patent Law Firm

(57) ABSTRACT

A coupling clamp-type pulse injection apparatus, which can couple a high-voltage wideband pulse having a peak voltage of several tens of kV and having a rising time of several hundreds of ps or less to a cable without causing dielectric breakdown and a 50 ohm impedance mismatch, is provided. The pulse injection apparatus includes an input connector, an output connector, and a main body including an inner plate connected at a first end thereof to the input connector and at a second end thereof to the output connector, and a coupling plate connected to the inner plate and configured to fix a cable to the inner plate and to couple a high-power electromagnetic pulse input through the input connector to the cable.

7 Claims, 7 Drawing Sheets

(56) References Cited

U.S. PATENT DOCUMENTS

| | | | |
|---|---|---|---|
| 7,026,888 B2* | 4/2006 | Antkowiak | H01P 5/183 333/121 |
| 7,420,794 B2* | 9/2008 | Olcen | H01T 4/08 361/111 |
| 8,134,818 B2* | 3/2012 | Alkan | H01P 1/202 361/116 |
| 2010/0253366 A1* | 10/2010 | Deibele | G01R 15/06 324/649 |
| 2012/0086528 A1 | 4/2012 | Ryu et al. | |
| 2012/0299669 A1 | 11/2012 | Ryu et al. | |

* cited by examiner

PULSE INJECTION APPARATUS

CROSS REFERENCE TO RELATED APPLICATION

This application claims the benefit of Korean Patent Application No. 10-2013-0074673filed on Jun. 27, 2013, which is hereby incorporated by reference in its entirety into this application.

BACKGROUND OF THE INVENTION

1. Technical Field

The present invention relates generally to a pulse injection apparatus and, more particularly, to a coupling clamp-type pulse injection apparatus, which is used for a test in the analysis of the effects of a conductive high-power electromagnetic pulse (EMP).

2. Description of the Related Art

High-power electromagnetic pulses may be divided into nuclear electromagnetic pulses and non-nuclear electromagnetic pulses. A nuclear electromagnetic pulse typically denotes a high altitude electromagnetic pulse (HEMP) caused by nuclear explosion occurring at an altitude of 30 km or more. A non-nuclear electromagnetic pulse denotes intentional high-power electromagnetics (HPEM) caused by instantaneous discharge or microwave resonance, an electromagnetic pulse caused by the grounding of a lightning bolt (lightning electromagnetic pulse: LEMP), a geomagnetic storm caused by sunspot activity of the sun, etc.

In order to defend a device against a high-power electromagnetic pulse, the test source of high-power electromagnetic pulse generation equipment, a measurement tool for analyzing effects on a device under test such as an electronic device, etc. are required.

Tests for analyzing the effects of such a high-power electromagnetic pulse may be chiefly divided into a radiative type and a conductive type. A radiative effect analysis test is configured to analyze which effect has been exerted on a device under test by radiating a high-power electromagnetic pulse to the air using pulse generation equipment and an antenna. A conductive effect analysis test is configured to analyze which effect has been exerted on a device under test by transferring overvoltage and overcurrent, also known as surge, occurring when a high-power electromagnetic pulse is induced in a power cable or a communication cable, to be the device under test.

In the case of two types of tests, a high-power electromagnetic pulse may be directly coupled to a cable such as a power cable or a communication cable. However, the radiative test is characterized in that the configuration of a test environment is complicated and thus cost is high, and in that the influence of a distance and a surrounding environment is large, and thus a pulse having intensity lower than the output of pulse generation equipment is coupled to the cable. Compared to this, the conductive test is configured such that a pulse is directly injected into the cable, and is advantageous in that the configuration of a test environment is simpler than that of the radiative test and a higher cable coupling voltage may be obtained.

For such a conductive effect analysis test for a high-power electromagnetic pulse, there is essentially required an injection device capable of coupling a high-power electromagnetic pulse to a cable.

In the case of a nuclear electromagnetic pulse (HEMP), the rising time of an ultra-short pulse corresponding to E1 is about 20 ns, and thus a commercial coupling clamp injection device used in typical high-voltage tests may be used. However, when a test is desired to be conducted on a non-nuclear electromagnetic pulse (HPEM), there is required a high-voltage wideband injection device that satisfies a reaction time corresponding to the rising time of several hundreds of ps and frequency performance.

Such high-voltage sub-nanosecond pulse injection devices may be divided into an inductive type and a capacitive type, wherein the capacitive type is more effective as a method of coupling high-frequency pulses having a short rising time.

Prior art related to this includes the paper entitled "Capacitive Coupling Clamp" published in IEEE SoftCOM conference in 2008. FIG. 1 is a diagram showing the core part of the paper, wherein most commercial coupling clamp injection devices that are currently sold have a structure and specification similar to those of the device in the paper. As specified in International Electrotechnical Commission (IEC) 61000-4-4 standard, an electrical fast transient/burst (EFT/B) is implemented to be coupled to a cable. A characteristic impedance is 50Ω, N-type connectors are used for input/output terminals, and a termination resistor of 50Ω is connected to the end of the device.

The coupling clamp injection device presented in the paper is designed to be capable of injecting pulses of up to 5 kV based on a pulse of 8/20 μs (rising time/pulse width), and injecting a pulse of 5/50 ns.

However, since the device is implemented using N-type I/O connectors having an insulation withstanding voltage, it cannot be used at a pulse having a peak voltage of several tens of kV or more. Further, since the device is implemented to be capable of injecting a pulse having a rising time of 5 ns, it may be difficult to use the device due to the problem of a parasitic component and impedance mismatch when a wideband pulse having a rising time of several hundreds of ps or less is injected. Therefore, it is difficult to use the coupling clamp injection device presented in the exiting paper or existing standards as a test device for injecting a high-voltage wideband pulse having a peak voltage of several tens of kV and having a rising time of several hundreds of ps or less.

Another prior art includes U.S. Pat. No. 5,477,153 (entitled "Electromagnetic pulse coupling network"). A coupling network device to be used for an effectiveness analysis test for a high-power electromagnetic pulse, which is disclosed in U.S. Pat. No. 5,477,153, is composed of three dummies (stacks) 1, 2, and 3 made of a circular ferrite core, as shown in FIG. 2. The two stacks 1 and 2 have the same diameter, and the third stack 3 has a diameter identical to the sum of the diameters of the two stacks 1 and 2. The central section of the first two stacks 1 and 2 configures a primary winding using a copper tube 4. A secondary winding is configured such that an insulting wire is wound around the first two stacks 1 and 2 to implement a 1:2 boosting step-up transformer, and the third stack 3 is configured to be coupled to the cable of a Device Under Test (DUT). The device disclosed in U.S. Pat. No. 5,477,153 is designed in an inductive coupling type, wherein a use frequency band ranges to 100 MHz, and a peak voltage of up to 3 kV is usable.

When calculation is made using the following Equation (1), frequencies of up to GHz must be usable so as to inject a pulse having a rising time of several hundreds of ps or less, but the injection device presented in U.S. Pat. No. 5,477,153 is disadvantageous in that only frequencies of up to 100 MHz can be used, and the magnitude of an injectable peak voltage is small, thus making it difficult to use the device as a device for injecting a high-voltage wideband pulse having a peak voltage of several tens of kV or more and having a rising time of several hundreds of ps.

$$f_{3dB} \approx \frac{0.35}{t_r} \quad (1)$$

where $f_{3dB}$ denotes a 3 dB bandwidth and $t_r$ denotes a rising time.

The above Equation (1) shows the frequency bandwidth depending on the rising time in a pulse waveform.

Although not shown in detail in the drawing, Montena EMC of Switzerland currently sells an injection device for coupling a high altitude electromagnetic pulse (HEMP) to a cable. This scheme has been developed to inject a short pulse in a coupling manner upon performing a pulsed current injection (PCI) test in the standard MIL-STD-188-125. This enables an E1 pulse of HEMP having a rising time of 20 ns to be injected at a maximum of 100 kV. This device has a sufficient injection voltage, but it is impossible to use the device to inject a wideband pulse having a rising time of several hundreds of ps.

SUMMARY OF THE INVENTION

Accordingly, the present invention has been made keeping in mind the above problems occurring in the prior art, and an object of the present invention is to provide a coupling clamp-type pulse injection apparatus, which can couple a high-voltage wideband pulse having a peak voltage of several tens of kV and having a rising time of several hundreds of ps or less to a cable without causing dielectric breakdown and a 50Ω impedance mismatch.

In accordance with an aspect of the present invention to accomplish the above object, there is provided a pulse injection apparatus including an input connector; an output connector; and a main body including an inner plate connected at a first end thereof to the input connector and at a second end thereof to the output connector, and a coupling plate connected to the inner plate and configured to fix a cable to the inner plate and to couple a high-power electromagnetic pulse input through the input connector to the cable, wherein each of the input connector and the output connector comprises an inner dielectric, a connector inner electrode formed through the inner dielectric, an external ground part configured to ground the connector inner electrode, and an outer dielectric configured to insulate the corresponding connector from the inner plate when connecting to the inner plate.

Preferably, the outer dielectric may be configured to cover a part of an outer surface of a corresponding one of the input connector and the output connector so that one end of the connector inner electrode of the corresponding connector is exposed to outside.

Preferably, the outer dielectric may be formed using an insulating material made of a plastic resin material.

Preferably, the input connector may be configured such that sizes of the connector inner electrode, the external ground part, and the inner dielectric thereof are determined using the following equation so as to maintain an impedance of 50 ohm, $$Z = \frac{138}{\sqrt{\varepsilon_r}} \log_{10}\left(\frac{D}{d}\right)$$

where d denotes an inner diameter of the connector inner electrode of the input connector, D denotes an outer diameter of the external ground part of the input connector, and $\in_r$ denotes a dielectric constant of the inner dielectric of the input connector.

Preferably, the output connector may be configured such that sizes of the connector inner electrode, the external ground part, and the inner dielectric thereof are determined using the following equation so as to maintain an impedance of 50 ohm, $$Z = \frac{138}{\sqrt{\varepsilon_r}} \log_{10}\left(\frac{D}{d}\right)$$

where d denotes an inner diameter of the connector inner electrode of the output connector, D denotes an outer diameter of the external ground part of the output connector, and $\in_r$ denotes a dielectric constant of the inner dielectric of the output connector.

Preferably, the coupling plate may be formed in a semi-circular shape or a polygonal shape and is fastened to the inner plate through a fastening member.

Preferably, the main body may be formed in a structure of a closed strip line, and a size of the inner plate may be determined so that a characteristic impedance is 50 ohm.

Preferably, the size of the inner plate may be determined by the following equation:

$$Z_0 = \frac{30}{\sqrt{\varepsilon_r}} l_n \left\{ 1 + \frac{4}{\pi} \frac{b-t}{W} \left[ \frac{8}{\pi} \frac{b-t}{W'} + \sqrt{\left(\frac{8}{\pi} \frac{b-t}{W'}\right)^2 + 6.27} \right] \right\}$$

$$\frac{W'}{b-t} = \frac{W}{b-t} + \frac{\Delta W}{b-t}$$

$$\frac{\Delta W}{b-t} = \frac{x}{\pi(1-x)} \left\{ 1 - \frac{1}{2} l_n \left[ \left(\frac{x}{2-x}\right)^2 + \left(\frac{0.0796x}{W/b+1.1x}\right)^m \right] \right\}$$

$$m = 2\left[1 + \frac{2}{3} \frac{x}{1-x}\right]^{-1}, \quad x = \frac{t}{b}$$

where $\in_r$ denotes a dielectric constant of the inner dielectric, W denotes a width of the inner plate, b denotes a thickness of the inner dielectric, and t denotes a thickness of the inner plate.

Preferably, the high-power electromagnetic pulse may be an electromagnetic pulse having a peak voltage of several tens of kV and having a rising time of several hundreds of ps or less.

Preferably, the output connector may be connected to a 50 ohm load.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
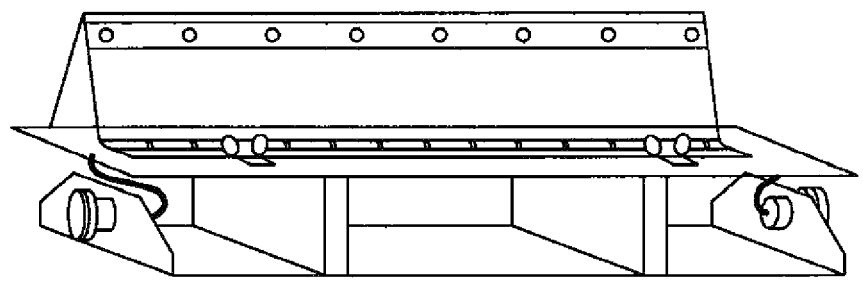
FIG. 1 is a diagram showing an example of a conventional coupling clamp injection device.
Figure 2:
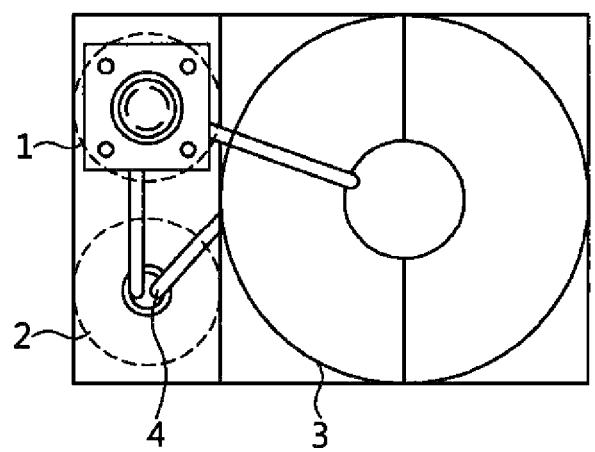
FIG. 2 is a diagram showing a conductive pulse injection device for a conventional high-power electromagnetic pulse injection test.

Hereinafter, a pulse injection apparatus according to embodiments of the present invention will be described in detail with reference to the attached drawings. Prior to the detailed description of the present invention, it should be noted that the terms or words used in the present specification and the accompanying claims should not be limitedly interpreted as having their common meanings or those found in dictionaries. Therefore, the embodiments described in the present specification and constructions shown in the drawings are only the most preferable embodiments of the present invention, and are not representative of the entire technical spirit of the present invention. Accordingly, it should be understood that various equivalents and modifications capable of replacing the embodiments and constructions of the present invention might be present at the time at which the present invention was filed.

Figure 3:
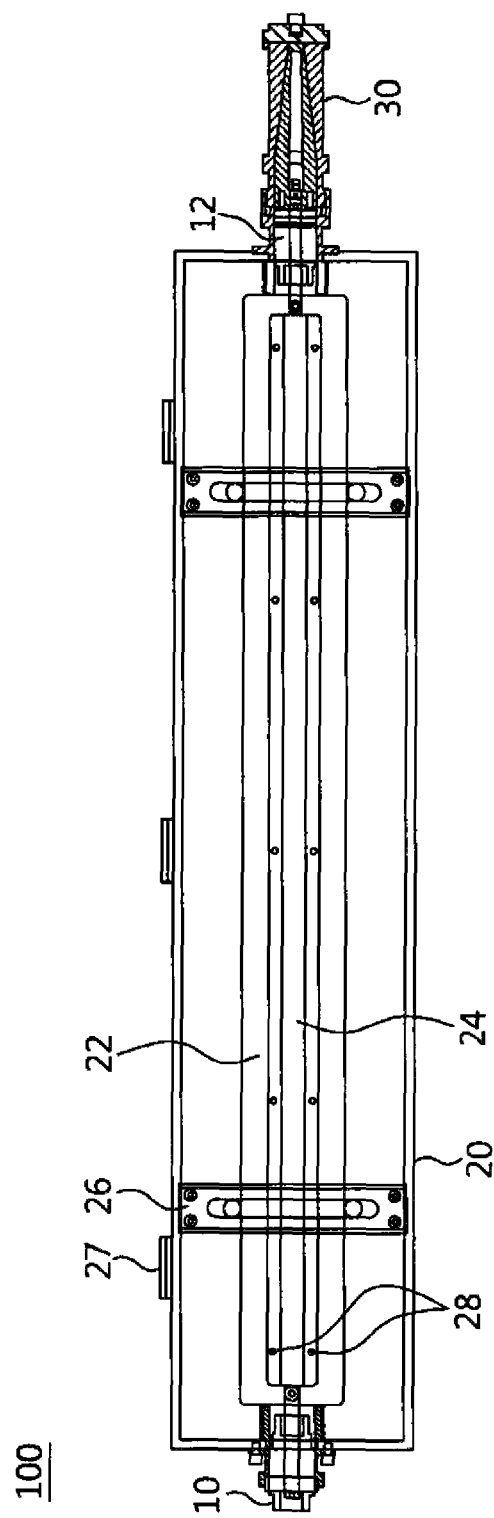
FIG. 3 is a diagram showing a pulse injection apparatus according to an embodiment of the present invention.
Figure 4:
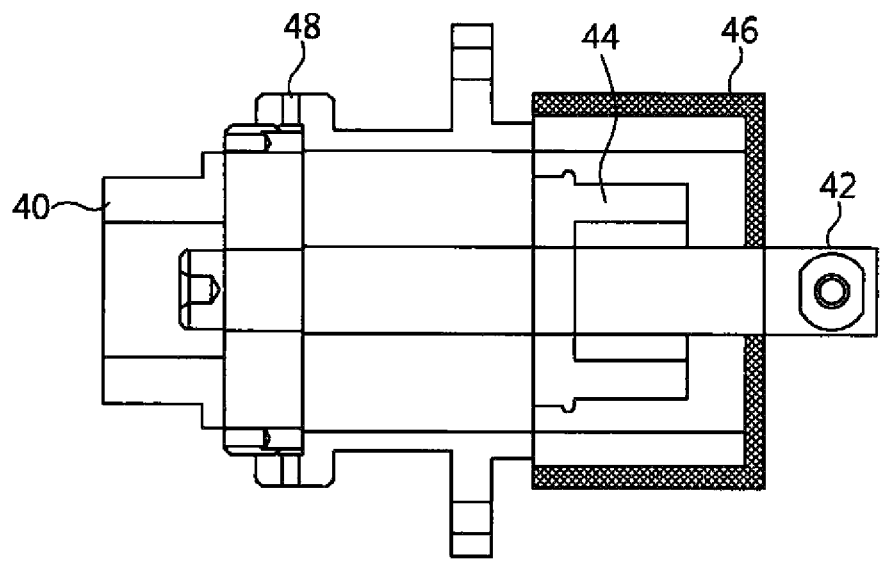
FIG. 4 is a diagram showing an input connector shown in FIG. 3.

FIG. 3 is a diagram showing a pulse injection apparatus according to an embodiment of the present invention, and FIG. 4 is a diagram showing an input connector shown in FIG. 3.

A pulse injection apparatus 100 according to an embodiment of the present invention is configured to couple a high-voltage wideband pulse signal having a peak voltage of several tens of kV and having a rising time of several hundreds of ps or less to a cable, and includes an input connector 10, an output connector 12, a main body 20, and a high-voltage 50Ω load 30.

The input connector 10 includes an input interface 40 that may be connected to a high-voltage coaxial cable, an inner dielectric 44 connected to the input interface 40, a connector inner electrode 42 formed through the inner dielectric 44, an external ground part 48 for grounding the connector inner electrode 42, and an outer dielectric 46 for insulating the input connector 10 from an inner plate 22 when the input connector is connected to the inner plate 22.

In this case, a cross-shaped or linear groove may be formed at one end of the connector inner electrode 42. This groove is configured to easily fasten the cable to the connector by simply rotating the connector inner electrode 42 upon assembling the core of the high-voltage coaxial cable with the connector inner electrode 42 in a thread coupling manner. When the replacement of the high-voltage coaxial cable or the replacement of the connector is required, thread coupling may be disassembled and the connector and the cable may be separated by rotating the connector inner electrode 42 counterclockwise along the groove in a reverse sequence of assembly. Even if this procedure is repeatedly performed, the input connector 10 and the cable may be permanently replaced and used unless a screw thread is damaged.

The inner dielectric 44 is formed along the outer surface of the connector inner electrode 42. The inner dielectric 44 may be made of an insulating material such as a plastic resin material (for example, Teflon).

in the above description, although the input interface 40 and the inner dielectric 44 have been illustrated as separate components, they may be integrated into a single component and collectively called a dielectric.

The input interface 40 formed on one side of the inner dielectric 44 is formed to be corrugated at a predetermined depth so that it is coupled to other connectors. For example, the input interface 40 may be formed to be corrugated in the shape of a protrusion and may be coupled to other connectors. That is, the inner dielectric 44 is formed such that the surface of the inner dielectric 44 is corrugated at a predetermined depth and then the surface length of the dielectric on a dielectric breakdown path is increased so as to secure insulation performance of several tens of kV or more, thus preventing dielectric breakdown from occurring against a high-voltage pulse signal.

The outer dielectric 46 covers a part of the external surface of the input connector 10 so that one end of the connector inner electrode 42 of the input connector 10 is exposed to the outside. The outer dielectric 46 is configured to insulate the input connector 10 from the inner plate 22 when the input connector 10 is connected to the inner plate 22 (also referred to as a "center electrode") in the main body 20. It is preferable to manufacture the input connector 10 so that the thickness of the outer dielectric 46 is decreased so as to reduce impedance mismatch and the outer dielectric 46 covers the input connector 10 so as to secure an insulation distance.

The outer dielectric 46 may be made of an insulating material such as a plastic resin material, for example, Teflon. Of course, if necessary, an insulating material such as a plastic resin material other than Teflon may be used to form the outer dielectric 46.

The external ground part 48 is formed of a conductor such as metal.

Meanwhile, a detailed configuration of the output connector 12 is considered to be identical to that of the above-described input connector 10, and thus the illustration and description thereof will be omitted.

In this way, the thickness of the high-voltage input connector 10 and output connector 12 is adjusted so that the input/output (I/O) connectors can be used at a peak voltage of several tens of kV or more using plastic resin such as Teflon having a high breakdown voltage. The impedance of the input/output connectors is maintained at 50Ω so that the impedance of the input/output connectors matches the output impedance of pulse generation equipment to improve injection performance.

In the above-described input connector 10 and output connector 12, the sizes of the connector inner electrode 42, the external ground part 48, and the inner dielectric 44 are determined by using the following Equation (2) so as to maintain an impedance of 50Ω:

$$Z = \frac{138}{\sqrt{\varepsilon_r}} \log_{10}\left(\frac{D}{d}\right) \quad (2)$$

where d denotes the inner diameter of the connector inner electrode 42, D denotes the outer diameter of the external ground part 48, and $\varepsilon_r$ denotes the dielectric constant of the inner dielectric 44.

In FIG. 3, the main body 20 is designed in the structure of a strip line and is implemented to open and close a cover. The main body 20 may be used by closing the cover after a cable under test, such as a power cable, has been mounted, thus enabling stability to be improved, upon performing a high-power electromagnetic pulse test.

Further, the strip line causes loss less than that of a microstrip line and is isolated from an external electric field due to ground metal plates isolated from each other at top and bottom layers to enable a stable operation, so that the main body 20 is formed in the structure of the strip line.

Such a main body 20 includes the inner plate 22 and a coupling plate 24.

The inner plate 22 is connected at one end thereof to the input connector 10 and at the other end thereof to the output connector 12. The inner plate 22 may be configured in the form of a strip line.

Although not shown in detail in FIGS. 3 and 4, a vertical groove is formed at the end of a part (that is, protrusion) of the connector inner electrode 42. Accordingly, both ends of the inner plate 22 are fitted to the vertical groove (not shown) of the connector inner electrode 42 of the input connector 10 and the vertical groove (not shown) of the connector inner electrode of the output connector 12, respectively, and thus the inner plate 22 is connected to the input/output connectors 10 and 12.

The coupling plate 24 is connected to the inner plate 22, so that a cable under test (for example, a power cable, a Local Area Network (LAN) cable, etc.) is fixed to the inner plate 22, and a high-power electromagnetic pulse input through the input connector 10 is coupled to the cable under test. Preferably, the coupling plate 24 is formed in a semi-circular shape or a polygonal shape, and is fastened to the inner plate 22 through fastening members such as screws 28. By means of this, the cable under test may be arranged in a mutual space formed by the fastening of the inner plate 22 and the coupling plate 24.

The high-voltage 50Ω load 30 is implemented to have an insulation voltage of a maximum of 100 kV. The high-voltage 50Ω load 30 is connected to the output connector 12 and is then terminated at a resistance of 50Ω.

In this case, the 50Ω load 30 may be separately manufactured and connected to the output connector 12, but if necessary, the output connector 12 may be manufactured to be integrated with the 50Ω load 30, or may be terminated using a high-voltage 50Ωresistor having an insulation withstanding voltage of several tens of kV.

In FIG. 3, reference numeral 26, not described, denotes a handle for mobility, and reference numeral 27, not described, denotes a clip required to fully close the cover.

Figure 5:
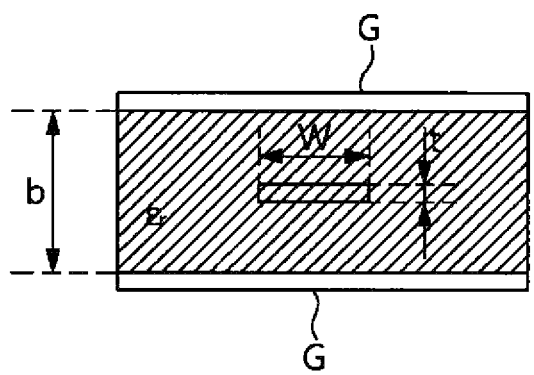
FIG. 5 is a diagram showing a method of designing an inner plate shown in FIG. 3.

FIG. 5 is a diagram showing a method of designing the inner plate shown in FIG. 3, and is a sectional view illustrating the structure of a strip line.

By the following Equation (3), the sizes of the inner plate 22 and the main body 20 may be determined.

Assuming that the thicknesses of ground metal plates G are uniform, the characteristic impedance of the strip line varies with the dielectric constant $\in_r$ of the inner dielectric 44, the width W of the inner plate 22, the thickness b of the inner dielectric 44, and the thickness t of the inner plate 22. In this case, the inner dielectric 44 of the input connector 10 and the inner dielectric 44 of the output connector 12 are made of the same material. Accordingly, the dielectric constant $\in_r$ of the inner dielectric 44 may be regarded as either of the dielectric constant of the inner dielectric 44 of the input connector 10 and the dielectric constant of the inner dielectric 44 of the output connector 12.

For example, when the dielectric constant of the inner dielectric 44 (for example, Teflon) is 2.1, the thickness of the inner plate 22 is 3 mm, and the thickness of the inner dielectric 44 is 65 mm, the width of the inner plate 22 is 85 mm if it is calculated based on the following Equation (3) so that the impedance $Z_0$ of the strip line is 50Ω.

$$Z_0 = \frac{30}{\sqrt{\varepsilon_r}} l_n \left\{ 1 + \frac{4}{\pi} \frac{b-t}{W} \left[ \frac{8}{\pi} \frac{b-t}{W'} + \sqrt{\left(\frac{8}{\pi} \frac{b-t}{W'}\right)^2 + 6.27} \right] \right\} \quad (3)$$

$$\frac{W'}{b-t} = \frac{W}{b-t} + \frac{\Delta W}{b-t}$$

$$\frac{\Delta W}{b-t} = \frac{x}{\pi(1-x)} \left\{ 1 - \frac{1}{2} l_n \left[ \left(\frac{x}{2-x}\right)^2 + \left(\frac{0.0796x}{W/b+1.1x}\right)^m \right] \right\}$$

$$m = 2\left[1 + \frac{2}{3} \frac{x}{1-x}\right]^{-1}, x = \frac{t}{b}$$

where $\in_r$ denotes the dielectric constant of the inner dielectric 44, W denotes the width of the inner plate 22, b denotes the thickness of the inner dielectric 44, and t denotes the thickness of the inner plate 22.

Figure 6:
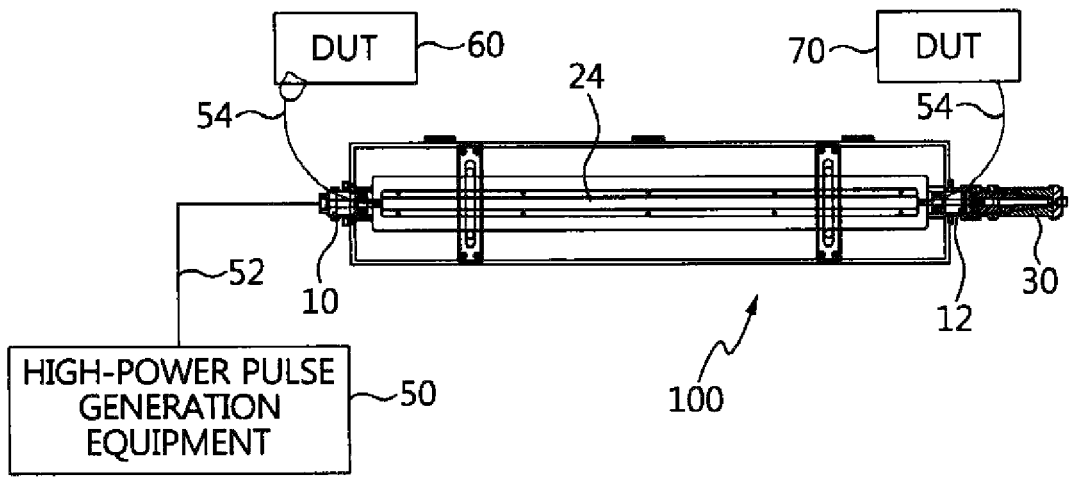
FIG. 6 is a configuration diagram showing a conductive pulse injection test using the pulse injection apparatus according to an embodiment of the present invention.

FIG. 6 is a configuration diagram showing a conductive pulse injection test using the pulse injection apparatus according to an embodiment of the present invention.

For the conductive pulse injection test, a power cable and/or signal line 54 are fixed by the inner plate 22 and the coupling plate 24 of the pulse injection apparatus 100 according to the embodiment of the present invention.

Further, Device Under Tests (DUTs) 60 or 70 are respectively connected to the input and the output of the power cable and/or signal line 54, and then the DUTs are implemented in a normal operation state. Meanwhile, the high-voltage 50106 load 30 is connected to the end of the output connector 12.

Further, high-power pulse (electromagnetic pulse) generation equipment 50 is connected to the input connector 10 via a high-voltage coaxial cable 52 and is configured to inject a high-power pulse into the connector 10.

By means of this configuration, conductive pulse injection may be tested using the pulse injection apparatus 100 according to the embodiment of the present invention.

Figure 7:
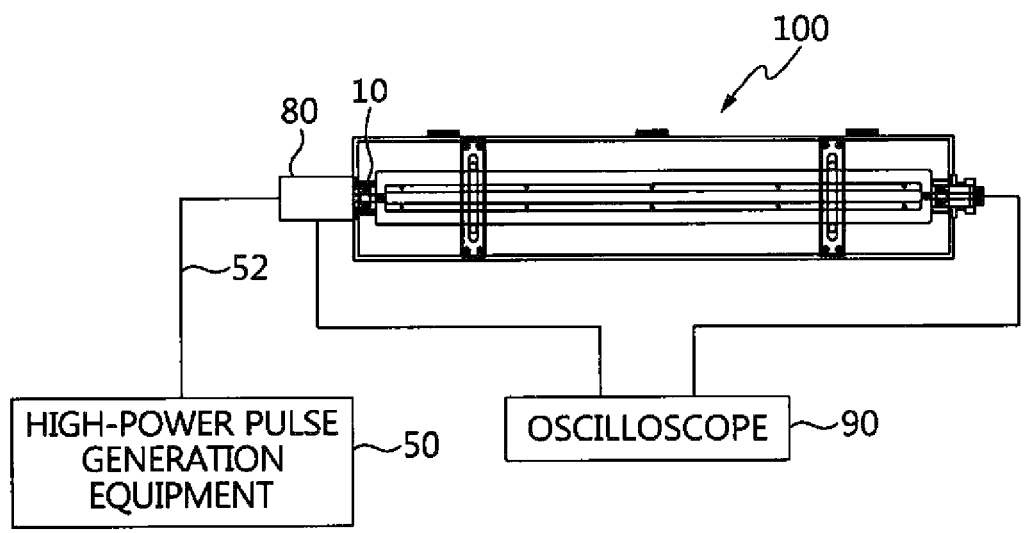
FIG. 7 is a configuration diagram showing a voltage pass characteristic test using the pulse injection apparatus according to an embodiment of the present invention.

FIG. 7 is a configuration diagram showing a voltage pass characteristic test using the pulse injection apparatus according to an embodiment of the present invention.

After the high-voltage 50Ω load 30 and the DUTs connected to the end of the pulse injection apparatus 100 of FIG. 6 are removed, the high-power pulse (electromagnetic pulse) generation equipment 50 is connected to the input connector 10 of the pulse injection apparatus 100 via a voltage distributor 80 using a high-voltage coaxial cable 52. In this case, the output connector 12 is measured via an oscilloscope 90 by adding an attenuator if necessary.

The configuration has been made in this way, and then the voltage pass characteristics of the pulse injection apparatus 100 according to the embodiment of the present invention may be tested.

Figure 8:
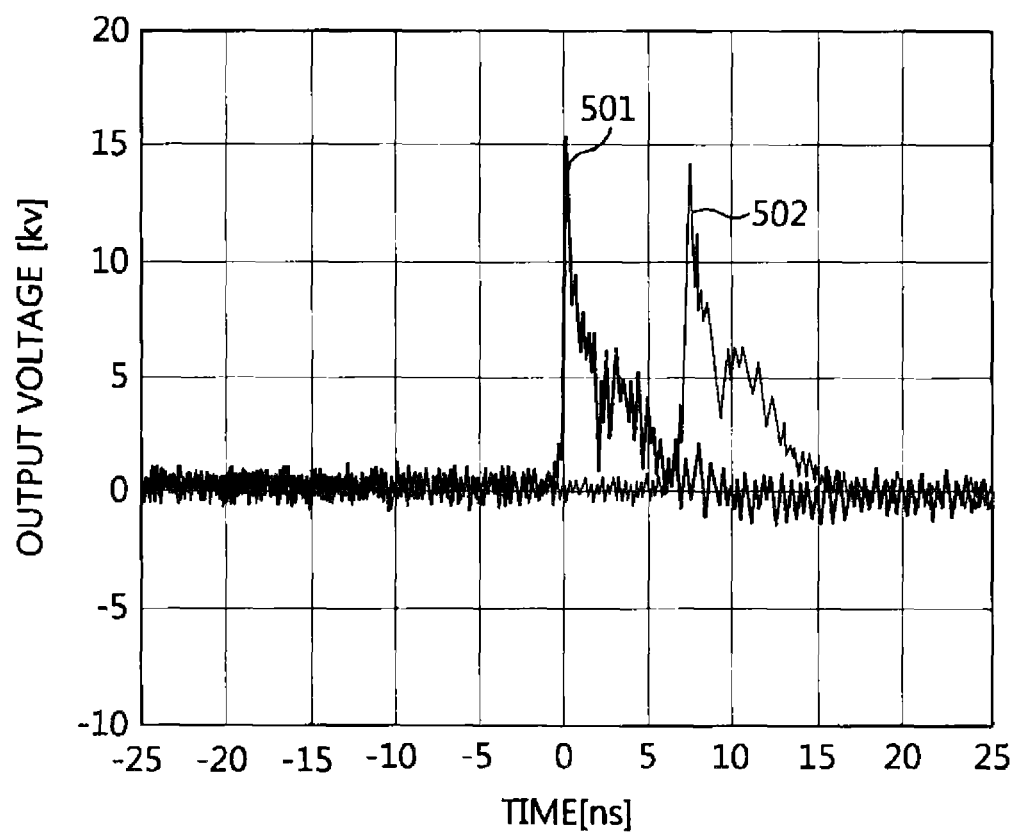
FIG. 8 is a waveform diagram showing voltage pass performance based on the configuration of FIG. 7.

FIG. 8 is a waveform diagram showing voltage pass performance based on the configuration of FIG. 7, and illustrates a waveform obtained by injecting a high-power pulse having a rising time of 110 ps and a peak voltage of 16 kV into the input connector 10 using the high-power pulse generation equipment 50 for generating the high-power pulse and by measuring output voltages at the voltage distributor 80 and the output connector 12 via the oscilloscope 90.

It can be proved that about 92% or more of an input pulse has passed through the pulse injection apparatus 100 via a pulse waveform 501 input to the pulse injection apparatus 100 and a pulse waveform 502 output from the apparatus 100. If this resulting value is converted into dB, it can be proved that only a loss of about 0.7 dB has occurred.

Therefore, it can be seen that a pulse having a rising time of several hundreds of ps and a peak voltage of several tens of kV is desirably injected into the pulse injection apparatus 100 according to the embodiment of the present invention.

Figure 9:
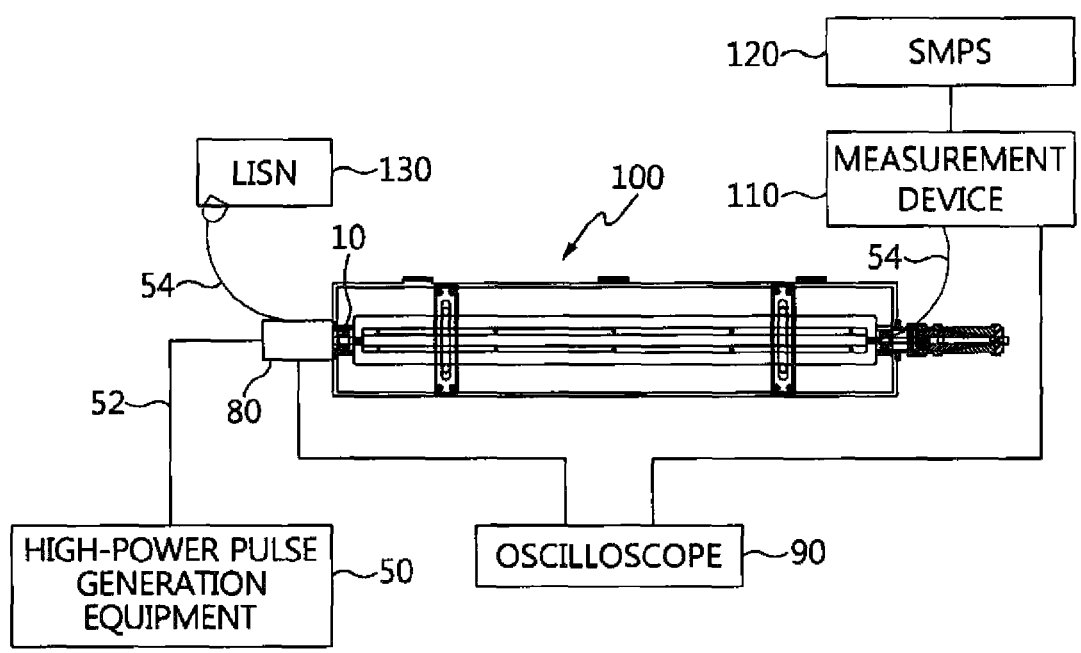
FIG. 9 is a configuration diagram showing a test for measuring the waveform of a voltage pulse coupled to a cable under test using the pulse injection apparatus according to an embodiment of the present invention.

FIG. 9 is a configuration diagram showing a test for measuring the waveform of a voltage pulse coupled to a cable under test using the pulse injection apparatus according to an embodiment of the present invention.

The test configuration is implemented such that a line impedance stabilization network (LISN; conductive noise measurement device) 130 and a switching-mode power supply (SMPS) 120 which are loads are connected to a power cable and/or a signal line 54, and respective waveforms of a voltage distributor 80 and a measurement device 110 are measured using an oscilloscope 90.

By means of this configuration, the waveform of a voltage pulse coupled to the cable under test (for example, the power cable and/or the signal line 54, a LAN cable, or the like) may be measured.

Figure 10:
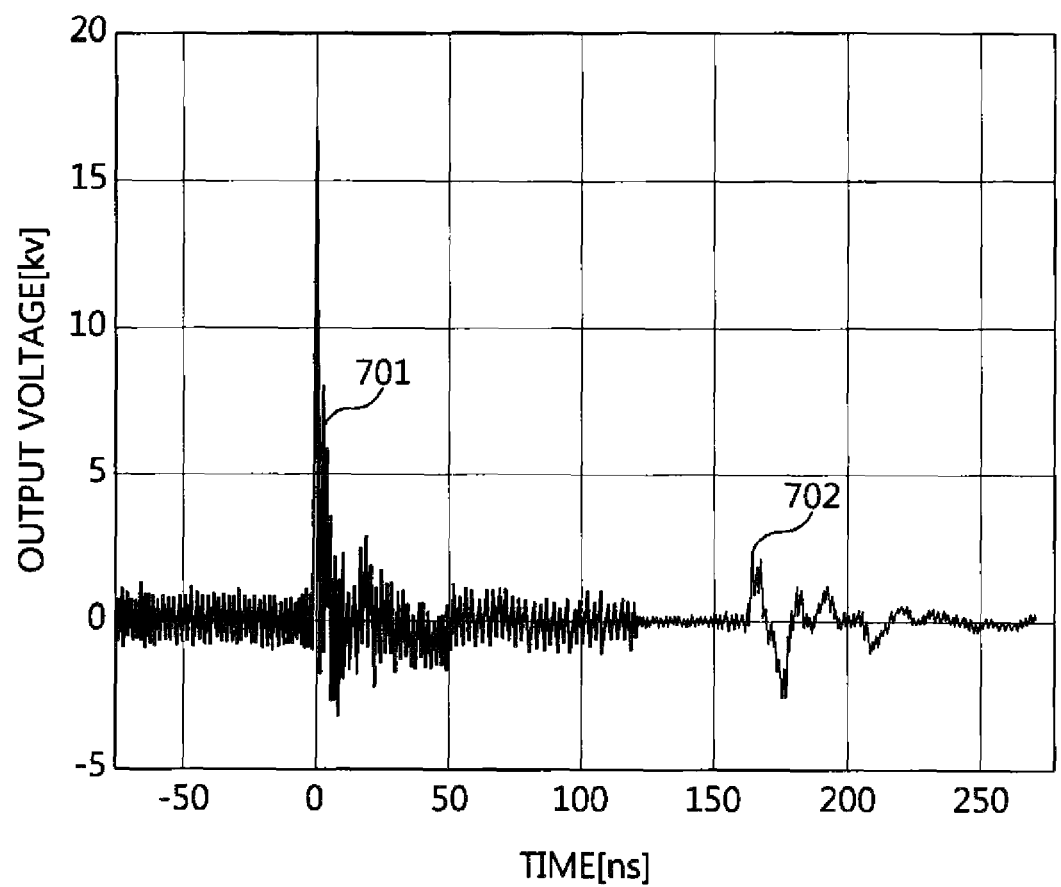
FIG. 10 is a waveform diagram showing the waveform of a voltage pulse coupled to a cable under test using the configuration of FIG. 9.

FIG. 10 is a waveform diagram showing the waveform of a voltage pulse coupled to a cable under test using the configuration of FIG. 9. In the drawing, the waveform is obtained by injecting a high-power pulse having a rising time of 110 ps and a peak voltage of 16 kV into the input connector 10 using high-power pulse generation equipment 50 for generating the high-power pulse, and by measuring the high-power pulse at a voltage distributor 80 and a measurement device 110 via an oscilloscope 90.

It can be provided that the high-power pulse is actually coupled to the power cable and/or signal line 54 via a pulse waveform 701 input to the pulse injection apparatus 100 according to the embodiment of the present invention and a pulse waveform 702 coupled to the cable.

It can be seen in FIG. .8 that most of a pulse having a rising time of 110 ps and a peak voltage of 16 kV is applied to the pulse injection apparatus 100 according to the embodiment of the present invention and that slight loss occurs when the pulse is coupled to the power cable and/or the signal line 54, whereas it can be seen in FIG. 10 that a coupling voltage is desirably generated.

As described above, in accordance with the present invention having the above configuration, a pulse signal having a peak voltage of several tens of kV or more and a rising time of several hundreds of ps or less may be coupled to a cable, thus simultaneously satisfying both wideband frequency characteristics and high insulation withstanding voltage.

In the present invention, the impedance of an input connector, a main body, and a termination load is accurately maintained at an impedance of 50Ω, thus improving injection efficiency with wideband frequency characteristics.

Further, the present invention leaves a sufficiently wide insulation space using plastic resin such as Teflon, having insulation resistance higher than that of the air, thus satisfying a high insulation withstanding voltage.

Accordingly, the apparatus of the present invention can inject a pulse having a rising time of several hundreds of ps or less and a peak voltage of several tens of kV or more compared to conventional devices, and thus the apparatus of the present invention can be used for a conductive effect analysis test for a high-power electromagnetic pulse.

As described above, optimal embodiments of the present invention have been disclosed in the drawings and the specification. Although specific terms have been used in the present specification, these are merely intended to describe the present invention and are not intended to limit the meanings thereof or the scope of the present invention described in the accompanying claims. Therefore, those skilled in the art will appreciate that various modifications and other equivalent embodiments are possible from the embodiments. Therefore, the technical scope of the present invention should be defined by the technical spirit of the claims.

What is claimed is:

1. A pulse injection apparatus comprising:
an input connector;
an output connector; and
a main body including an inner plate connected at a first end thereof to the input connector and at a second end thereof to the output connector, and a coupling plate connected to the inner plate and configured to fix a cable to the inner plate and to couple a high-power electromagnetic pulse, which has a peak voltage of tens of kilovolts and a rising time of hundreds of picoseconds or less and is input through the input connector, to the cable,
wherein each of the input connector and the output connector comprises an inner dielectric, a connector inner electrode formed through the inner dielectric, an external ground part configured to ground the connector inner electrode, and an outer dielectric configured to insulate a corresponding one of the input connector and the output connector from the inner plate when connecting to the inner plate,
wherein the main body is formed in a structure of a closed strip line, and a size of the inner plate is determined so that a characteristic impedance is 50 ohm, and
wherein the size of the inner plate is determined by the following equation:

$$Z_0 = \frac{30}{\sqrt{\varepsilon_r}} l_n \left\{ 1 + \frac{4}{\pi} \frac{b-t}{W} \left[ \frac{8}{\pi} \frac{b-t}{W'} + \sqrt{\left(\frac{8}{\pi} \frac{b-t}{W'}\right)^2 + 6.27} \right] \right\}$$

$$\frac{W'}{b-t} = \frac{W}{b-t} + \frac{\Delta W}{b-t}$$

$$\frac{\Delta W}{b-t} = \frac{x}{\pi(1-x)} \left\{ 1 - \frac{1}{2} l_n \left[ \left(\frac{x}{2-x}\right)^2 + \left(\frac{0.0796x}{W/b+1.1x}\right)^m \right] \right\}$$

$$m = 2\left[ 1 + \frac{2}{3} \frac{x}{1-x} \right]^{-1}, x = \frac{t}{b}$$

where $\varepsilon_r$ denotes a dielectric constant of the inner dielectric, W denotes a width of the inner plate, b denotes a thickness of the inner dielectric, and t denotes a thickness of the inner plate.

2. The pulse injection apparatus of claim 1, wherein the outer dielectric is configured to cover a part of an outer surface of the corresponding one of the input connector and the output connector so that one end of the connector inner electrode of the corresponding connector is exposed to outside.

3. The pulse injection apparatus of claim 1, wherein the outer dielectric is formed using an insulating material made of a plastic resin material.

4. The pulse injection apparatus of claim 1, wherein the input connector is configured such that sizes of the connector inner electrode, the external ground part, and the inner dielectric thereof are determined using the following equation so as to maintain an impedance of 50 ohm, $$Z = \frac{138}{\sqrt{\varepsilon_r}} \log_{10}\left(\frac{D}{d}\right)$$

where d denotes an inner diameter of the connector inner electrode of the input connector, D denotes an outer diameter of the external ground part of the input connector, and $\in_r$ denotes a dielectric constant of the inner dielectric of the input connector.

5. The pulse injection apparatus of claim 1, wherein the output connector is configured such that sizes of the connector inner electrode, the external ground part, and the inner dielectric thereof are determined using the following equation so as to maintain an impedance of 50 ohm, $$Z = \frac{138}{\sqrt{\varepsilon_r}} \log_{10}\left(\frac{D}{d}\right)$$

where d denotes an inner diameter of the connector inner electrode of the output connector, D denotes an outer diameter of the external ground part of the output connector, and $\in_r$ denotes a dielectric constant of the inner dielectric of the output connector.

6. The pulse injection apparatus of claim 1, wherein the coupling plate is formed in a semicircular shape or a polygonal shape and is fastened to the inner plate through a fastening member.

7. The pulse injection apparatus of claim 1, wherein the output connector is connected to a 50 ohm load.

* * * * *